United States Patent [19]

Maeda

[11] Patent Number: 5,316,975
[45] Date of Patent: May 31, 1994

[54] METHOD OF FORMING MULTILEVEL INTERCONNECTIONS IN A SEMICONDUCTOR INTEGRATED CIRCUIT

[75] Inventor: Akitoshi Maeda, Tokyo, Japan
[73] Assignee: NEC Corporation, Japan
[21] Appl. No.: 823,163
[22] Filed: Jan. 21, 1992
[30] Foreign Application Priority Data Jan. 22, 1991 [JP] Japan .................................. 3-005491

[51] Int. Cl.$^5$ .................... H01L 21/441; H01L 21/465
[52] U.S. Cl. ..................................... 437/195; 437/194; 437/228; 148/DIG. 50
[58] Field of Search .............. 437/195, 974, 194, 228; 148/DIG. 50, DIG. 135, DIG. 158

[56] References Cited

U.S. PATENT DOCUMENTS 4,902,645  2/1990  Ohba .............................. 437/195 X
5,081,064  1/1992  Inoue et al. ..................... 437/195 X

*Primary Examiner*—John S. Maples
*Attorney, Agent, or Firm*—Laff, Whitesel, Conte, Saret

[57] ABSTRACT

A method is disclosed for producing integrated circuit apparatus in which electroconductive interconnection films are disposed adjacent to each other and have an insulating film sandwiched therebetween. The electroconductive films are electrically connected with each other via a through-hole formed in the insulating film. First, a through-hole is formed in an insulating film so as to extend to the surface of a first electroconductive interconnection film. Then, extraneous materials existing on the surfaces of the insulating film and the electroconductive film exposed in the through-hole are removed by a sputter etching method. Next, an insulating film covering film ("covering film") is formed by a sputtering method on said insulating film by using a material which is the same material that is used for forming a second electroconductive interconnection film. Subsequently, the sputter etching method is used again to remove the covering film. Finally, the second electroconductive interconnection film is formed on the insulating film and makes electrical contact with the first electroconductive film via the through-hole.

12 Claims, 5 Drawing Sheets

METHOD OF FORMING MULTILEVEL INTERCONNECTIONS IN A SEMICONDUCTOR INTEGRATED CIRCUIT

BACKGROUND OF THE INVENTION

1. Field of the Invention

This invention relates to a method of producing integrated circuit apparatus and more particularly, to a method of producing integrated circuit apparatus in which electroconductive interconnection films adjacently disposed having an insulating film sandwiched therebetween are electrically connected with each other via a through-hole formed in the insulating film.

2. Description of the Prior Art

Recently, semiconductor large scale integrated circuits (LSI) are formed in a multilevel interconnection structure in many cases in order to meet the requirements of high density and high speed. The multilevel interconnection structure is formed as follows; First, a first electroconductive interconnection film is formed on a substrate to be patterned, and an interlayer insulating film is formed on the first electroconductive interconnection film thus patterned. Next, after an opening through which an electrical connection is taken therebetween has been formed in the interlayer insulating film, a second electroconductive interconnection film is formed on the interlayer insulating film to be patterned. Also, in the same manner as above, an interlayer insulating film is formed on the second electroconductive film thus patterned, then, an opening is formed in the interlayer insulating film, and a third electroconductive interconnection film is further formed on the interlayer insulating film. As shown above, the multilevel interconnection structure is formed such that an insulating film and an electroconductive interconnection film are laminated alternately on a substrate. The opening formed in the insulating film is called "through-hole", through which the electrical connection is taken between upper and lower electroconductive films.

As the electroconductive interconnection film, a metal film made of aluminum or its alloy has been widely used. On the other hand, as the interlayer insulating film, a silicon oxide film and silicon nitride film have been used in many cases. However, the recent trend is that such an oxygen containing insulating film that is formed of silicon oxide, silicon oxide nitride or the like by, for example, the plasma CVD is mainly used for this purpose. This is because the use of oxygen containing insulating film allows to reduce the stress to be applied to an electroconductive interconnection film as compared with the use of silicon nitride film, so that the stress migration of the electroconductive film can be effectively prevented and at the same time, the dielectric capacity can be reduced to improve the signal transmission speed.

With the multilevel interconnection structure, in order to planarize the surface of a film to be formed, it is general to sandwich a silicon compound layer including silica film between insulating films, or to use a silicon compound such as silicon polyimide incombination therewith. These silicon compounds contain oxygen, so that similar to the case of using silicon oxide or silicon oxide nitride as shown above, the stress-migration of an electroconductive interconnection film can be effectively prevented.

In case of producing a semiconductor integrated circuit apparatus in the above-described multilevel interconnection structure, after perforating a through-hole in an interlayer insulating film formed on a first electroconductive interconnection film, a second electroconductive interconnection film is formed on the interlayer insulating film through the steps or the following processes in order to provide a good ohmic contact between the adjacent electroconductive films;

First, the through-hole is perforated in the interlayer insulating film by an etching method with a photo-resist as the mask, and then, the photo-resist is subjected to a dry/wet treatment to be separated and removed therefrom (through-hole forming process). Next, sputter etching is applied thereto under the vacuum condition thereby removing extraneous materials existing on the surfaces of the interlayer insulating film and the electroconductive interconnection film exposed into the through-hole (extraneous materials removing process). In this case, as an extraneous material to be removed therefrom, there can be pointed out, for example, a metal oxide which is produced by reacting a component of the electroconductive interconnection layer with the oxygen in the air to be adhered onto the surface of the electroconductive film exposed into the through-hole, and a reaction product which is produced in the through-hole forming process to be adhered onto the surface of the electroconductive film and the side surface of the insulating film in the through-hole and residually existed even after the photo-resist removing process.

Subsequently, the second electroconductive interconnection film is formed on the interlayer insulating film thus obtained as above by a sputtering method under the same vacuum condition as applied in the extraneous materials removing process (electroconductive interconnection film forming process). As shown above, the sputter etching process for removing these extraneous materials and the sputtering process for forming the second electroconductive interconnection film are carried out subsequently under the same vacuum condition.

In case of an existing silicon compound layer between insulating films, or in case of a silicon compound layer in combination with the other insulating film(s) and insulating films, by heating the substrate under the same vacuum condition as applied in the electroconductive film forming process, gases including moisture are to be sufficiently removed from the silicon compound layer in advance.

In this case, however, according to the experiments, with the conventional method as shown above, it is found that even if the etching conditions in the through-hole forming process and the sputter etching conditions in the extraneous materials removing process are optimized, the ohmic contact between electroconductive interconnection films becomes disadvantageously unstable, and it cannot be taken at all depending on, for example, the temperature hysteresis occurring thereafter. Why such a problem as shown above is arisen was examined variously and found to occur for the following reasons;

First, when the sputter etching technique is applied thereto in the extraneous materials removing process, molecules of the interlayer insulating film are dissociated from its top surface and/or side surface to be adhered onto the surface of the electroconductive film exposed into the through-hole. In the case of being used an oxygen containing insulating film such as to be made of silicon oxide or silicon oxide nitride, the oxygen dissociated from the insulating film is re-combined with a metal component of the electroconductive film exposed into the through-hole thereby to generate a metal oxide to be adhered onto the surface of the electroconductive film itself. As a result, the extraneous materials thus adhered thereonto hamper the complete interface connection of the adjacent electroconductive films, resulting in unstable ohmic contact between the adjacent interconnection layers.

In addition, if a temperature change is additionally applied thereto while the complete interface connection between the electroconductive films cannot be provided, or if an electric current is applied thereto, the stress-migration and/or electro-migration will be generated at the interface thereof, so that the both of electroconductive films can be completely shielded finally. This means that the ohmic contact cannot be obtained at all between the electroconductive films.

This invention was made in consideration of the above-mentioned disadvantageous situation, and an object of this invention is to provide a method of producing integrated circuit apparatus capable of providing a stable and superior ohmic contact between adjacent electroconductive interconnection films and a good resistance to the stress-migration and electro-migration of the electroconductive interconnection films.

SUMMARY OF THE INVENTION

According to this invention, a through-hole is perforated into an insulating film so as to extend to the surface of an electroconductive interconnection film, and then, a sputter etching is applied thereto to remove extraneous material adhesively existed onto the surfaces of the insulating film and said electroconductive film exposed into the through-hole. Next, an insulating film covering film (covered film) is formed on said insulating film by using a material which is the same material that is used for forming a next electroconductive interconnection film adjacently to the insulating film. Subsequently, the sputter etching is applied thereto again to remove the insulating film covering film, and said next electroconductive interconnection film is formed on the surface of the insulating film.

If the through-hole is perforated into the insulating film so as to extend to the surface of the electroconductive interconnection film by a photolithographic process or the like, a metal oxide or the like will be adhered onto the surface of the electroconductive film exposed into the through-hole. Such metal oxide is produced by the reaction of a metal component of the electroconductive film with the oxygen in the air. In addition, on the side surface of the insulating film and the surface of the electroconductive film in the through-hole, reaction products produced during etching will be residually existed. As a result, when the insulating film is followed by the sputter etching, these extraneous materials being adhered thereonto can be removed, while the molecules of the insulating film are dissociated by the sputter etching to be adhered onto the surface of the electroconductive film exposed into the through-hole. It should be noted that the extraneous materials are removed from both the insulating film and the underlying electroconductive film exposed in the through-hole. In addition, if the insulating film contains oxygen, the oxygen dissociated from the insulating film is re-combined with a metal component of the electroconductive film to produce a metal oxide, which is adhered onto the surface thereof.

As a result, the extraneous materials adhesively existed onto said insulating film having the through-hole perforated thereinto and the electroconductive film exposed into the through-hole are removed by the sputter etching technique, then, an insulating film covering film is formed on the insulating film using the same material as is used for forming the next electroconductive interconnection film adjacently to the insulating film, and thereafter, the covering film thus formed is removed by sputter etching. In this case, accompanied with the sputter etching for the second time, the extraneous materials adhesively existed onto the surface of the electroconductive film exposed into the through-hole, that is, the dissociated molecules from the insulating film and the metal oxides produced by reacting the metal component of the electroconductive film with the oxygen dissociated from the insulating film can be removed. And yet, the sputter etching for the second time is carried out with the same material as that of the electroconductive interconnection film as the target, so that such a phenomenon that is occurred caused by the dissociation of the molecules and the oxygen from the insulating film can be prevented. In addition, even if the dissociation of the first electroconductive film is occurred by the sputter etching for the second time, the dissociated atoms are of the same material as is used for forming the next electroconductive interconnection film, so that no problem on the ohmic contact between these electroconductive interconnection films is arisen.

The reason of carrying out the sputter etching two times is that the insulating film covering film cannot completely be removed by the second sputter etching process thereby to be remained on the side surface of the interlayer insulating film in the through-hole, which means that the second sputter etching does not allow the removal of reaction products adhesively existed onto the side surface of said interlayer insulating film. As a result, the removal of them is made by the first sputter etching process.

In case that the through-hole is small in diameter and large in aspect ratio, it is preferable that the insulating film covering film is appropriately formed on the side surface of the interlayer insulating film by effectively introducing, for example, a bias sputtering method as the sputtering process to be carried out for the first time. In addition, in event that appropriate formation of the insulating film covering film cannot be achieved even by effecting the bias sputtering method, the aspect ratio of the through-hole is necessary to be reduced.

The above-mentioned metal film is formed by the sputtering method in general. However, it may be formed by any of other methods including a deposition and an ion plating. In addition, the extraneous materials removing process, insulating film covering film forming process, insulating film covering film removing process and next electroconductive interconnection film forming process are preferable to be carried out subsequently under vacuum condition. Further in addition, the insulating film is preferable to contain oxygen, the electroconductive interconnection film is preferable to be formed of aluminum, and said insulating film covering film formed on the interconnection film is preferable to be formed of either aluminum or titanium.

DETAILED DESCRIPTION OF THE PREFERRED EMBODIMENTS

Figure 1:
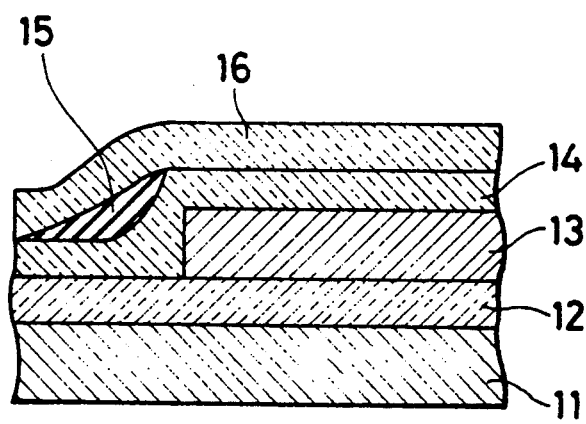
FIGS. 1 to 5 respectively show the states according to a first embodiment of this invention, in which FIG. 1 cross-sectionally shows the state of being formed a first electroconductive interconnection film and an interlayer insulating film on a substrate, FIG. 2 cross-sectionally shows the state of being perforated a through-hole into the interlayer insulating film shown in FIG. 1, FIG. 3 cross-sectionally shows the state is being formed an aluminum film on the interlayer insulating film shown in FIG. 2, FIG. 4 cross-sectionally shows the state of being removed an extraneous material adhered onto the surface of a first electroconductive interconnection film exposed into a through-hole, and FIG. 5 cross-sectionally shows the state of being formed a second electroconductive interconnection film on the interlayer insulating film shown in FIG. 4.

Some embodiments of this invention will be described below while referring to the drawings.

First Embodiment

FIGS. 1 to 5 are cross-sectional views for explaining respective processes to be used in a first embodiment of this invention. In this embodiment, an interlayer insulating film is a laminated one comprising silicon oxide layers having an silicon compound layer including silica film sandwiched therebetween. Here, description will be made on the case of two-level interconnection structure for the sake of easy understanding.

First, the surface of a silicon substrate 11 is oxidized, for example, thermally thereby forming a silicon oxide layer 12 thereon. Next, on the silicon oxide layer 12 thus formed is formed a first electroconductive interconnection film 13 of aluminum by an appropriate method including sputtering. Then, a low temperature silicon oxide layer 14 is formed on the first electroconductive film 13 and the silicon oxide layer 12 using any of the CVD, plasma CVD and bias sputtering methods. A silicon compound is coated on the low temperature silicon oxide layer 14 thus formed, and subjected to heat-treatment and planarization (in this embodiment, being subjected to etch-back treatment additionally) to form a silicon compound layer 15. A low temperature silicon oxide layer 16 is formed thereon again. Thus a first interlayer insulating film is provided comprising the low temperature silicon oxide layer 14, the silicon compound layer 15 and the low temperature silicon oxide layer 16. FIG. 1 cross-sectionally shows the forming state of the first interlayer insulating film in this case. Also, a low temperature silicon oxide nitride layer and a low temperature silicon nitride layer may be formed by the plasma CVD method instead of the low temperature silicon oxide layers 14 and 16.

Figure 2:
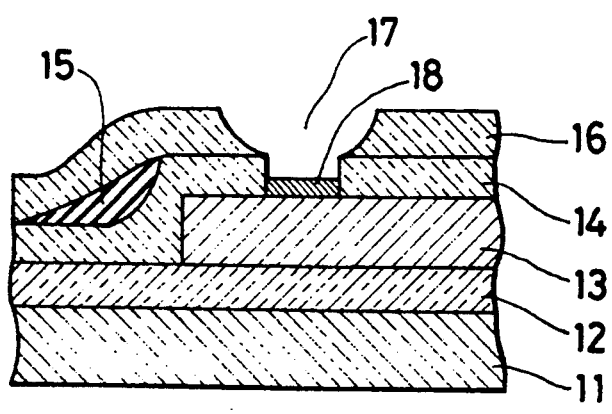

Next, a through-hole 17 is perforated photolithographically into the first interlayer insulating film so as to attain to the surface of the first electroconductive interconnection film 13. FIG. 2 shows an example of forming the through-hole 17 by etching isotropically and anisotropically. As shown in FIG. 2, on the surface of the first electroconductive film 13 is existed an aluminum oxide layer 18 which is produced by reacting the aluminum atoms of the first electroconductive film 13 with the oxygen in the air. In the through-hole forming process, the anisotropic etching is carried out under such a condition that a reaction product (for example, fluoropolymer) of a photo-resist with an etching gas becomes small. Such reaction product can be about completely removed through the photo-resist removing process including dry and wet treatments.

Figure 3:
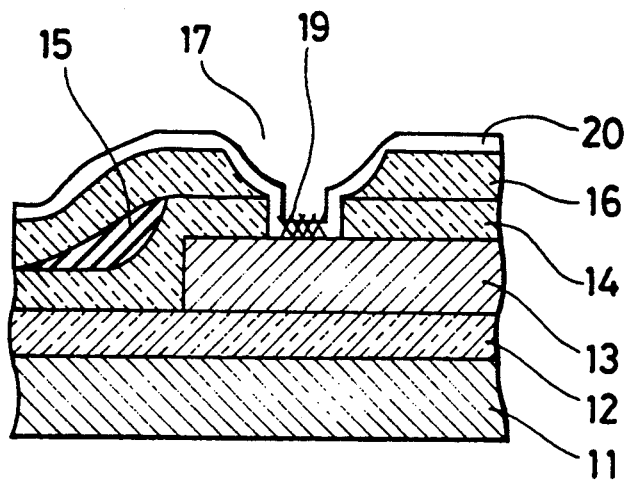

Next, the sputter etching is carried out by high-frequency discharging an inert gas including argon under the application of a pressure of several millitorrs, thus removing the aluminum oxide layer 18 being adhered onto the surface of the first electroconductive interconnection 13 and the above-mentioned reaction product which is produced in the through-hole forming process and remained being not removably therefrom through the photo-resist removing process. Through this process, the aluminum oxide film 18 and said reaction product are removed, however, as shown in FIG. 3, an extraneous material 19 is adhesively existed on the first aluminum interconnection film 13 exposed into the through-hole 17. This extraneous material 19 is formed by adhering the molecules dissociated from the first interlayer insulating film onto the surface of the first electroconductive film 13 exposed into the through-hole 17. In this embodiment, the low temperature silicon oxide layer 16 contains oxygen, so that the extraneous material 19 contains an aluminum oxide which is produced by re-combining the oxygen dissociated from the low temperature silicon oxide layer 16 with the aluminum atoms of the first electroconductive film 13. In such a phenomenon the extraneous material 19 is produced on the surface of the first electroconductive film 13, as shown above, and unavoidable occurs accompanied with the sputter etching process, which is considered to be unavoidable even if the sputteretching conditions are optimized.

Next, an inert gas such as argon is electrically discharged under the application of a pressure of several millitorrs and as shown in FIG. 3, an aluminum film 20 with a thickness of about 40 nm is formed by a sputtering method on the low temperature silicon oxide layer 16. The aluminum film 20 is provided on the whole surface of the low temperature silicon oxide layer 16. The aluminum film 20 has a thickness of 5 to 20 nm within the through-hole 17. The material of the film 20 is selected as to be equal to that of a second electroconductive interconnection film. In this embodiment, the second electroconductive interconnection film is formed of aluminum, which means that the film 20 also is formed of aluminum. When the aluminum film 20 is formed, the extraneous material 19 including aluminum oxide and silicon oxide and the like partially remains at the interface between the first electroconductive film 13 and the aluminum 20 within the through-hole 17.

Figure 4:
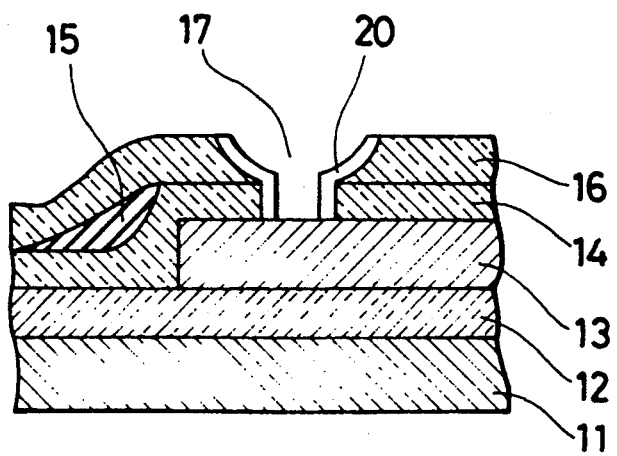

Next, the sputter etching is carried out again under the same condition as that of the sputter etching carried out for removing the aluminum oxide 18 to remove the aluminum film 20 formed in the preceding process. The sputter etching is carried out anisotropically, so that the aluminum film 20 can be sufficiently etched on the top surface of the first interlayer insulating film and the surface of the first electroconductive film 13 exposed into the through-hole 17, but insufficiently made on the side surface of the first interlayer insulating film in the through-hole 17. Again, it should be noted that the extraneous materials are removed from both the insulating film and the underlying electroconductive film exposed in the through-hole. The etching action is attained to the interface between the first electroconductive film 13 and the through-hole 17, and the sputter etching process is finished at the time point when the aluminum film 20 and the extraneous material 19 which are formed on the surface of the first electroconductive film 13 at the bottom of the through-hole 17 are completely removed. Thus, the aluminum film 20 is remained only on the side surface of the first interlayer insulating film within the through-hole 17 as shown in FIG. 4.

In this process, the sputter etching is effected with the aluminum film 20 as the target, which means that the aluminum atoms are re-adhered onto the surface of the first electroconductive film 13 exposed into the through-hole 17 by the sputtering etching. As a result, no occurrence of a problem on the ohmic contact results. Also, from the same reason, the oxygen dissociated from the first interlayer insulating film has no recombination with the aluminum atoms, resulting in no occurrence of such problem as on the ohmic contact due to the dissociation of oxygen therefrom.

After the completion of sputter etching of the aluminum film 20 as above, an aluminum film is formed by sputtering on the first interlayer insulating film at a predetermined thickness as a second electroconductive interconnection film. A series of these sputter etching and sputtering processes as shown above are carried out subsequently under the same vacuum condition without exposing the substrate 11 to the air. In addition, the substrate 11 is heated appropriately in order to prevent the gases including moisture from being released from the silicon compound layer 15.

Figure 5:
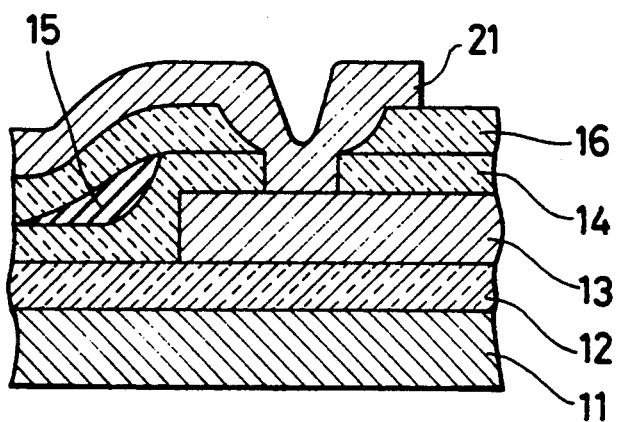

Through the above-described processes, the extraneous material 19 being unavoidably adhesively formed on the first electroconductive interconnection film 13 exposed into the through-hole 17 can be nearly completely removed. Accordingly, a stable ohmic contact can be obtained in the through-hole 17. Then, the aluminum film thus formed on the first interlayer insulating film is etched through the photolithographic process, thus forming a second electroconductive interconnection film 21 as shown in FIG. 5.

In case of laminating electroconductive interconnection films in more than three levels, or making the multi-level interconnection structure, a second interlayer insulating film is further formed on the second interconnection film 21, then the through-hole forming process is applied thereto and a series of processes as described above may be applied repeatedly.

Second Embodiment

FIGS. 6 to 10 are cross-sectional views for explaining respective processes to be used in a second embodiment of this invention. The second embodiment describes on the three-level interconnection structure, and a laminated film comprising an organic silicon compound layer made of, for example, silicon polyimide and a silicon oxide nitride layer is used as a second interlayer insulating film.

Figure 6:
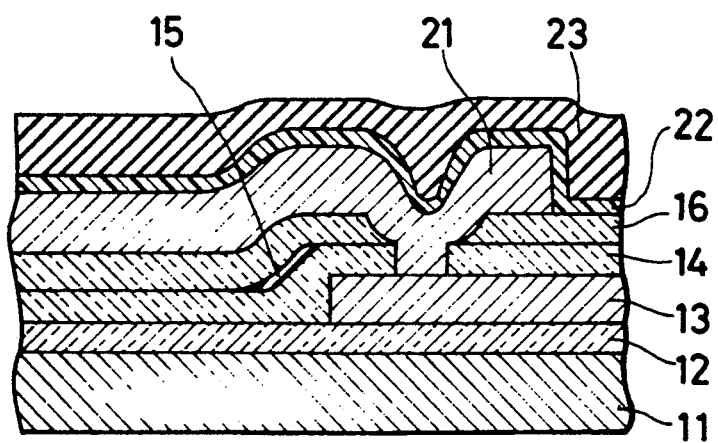
FIGS. 6 to 10 respectively show the states according to a second embodiment of this invention, in which FIG. 6 cross-sectionally shows the state of being formed a second electroconductive interconnection film, a first interlayer insulating film, a second electroconductive interconnection film and a second interlayer insulating film on a substrate, FIG. 7 cross-sectionally shows the state of being perforated a through-hole into the second interlayer insulating film shown in FIG. 6, FIG. 8 cross-sectionally shows the state of being formed a titanium film on the second interlayer insulating film shown in FIG. 7, FIG. 9 cross-sectionally shows the state of being removed an extraneous material adhered onto the surface of a second electroconductive interconnection film exposed into a through-hole, and FIG. 10 cross-sectionally shows the state of being formed a third electroconductive interconnection film on the second interlayer insulating film shown in FIG. 9.

In the same manner as was used in the first embodiment already described above, a silicon oxide layer 12, a first electroconductive interconnection film 13 of aluminum, low temperature silicon oxide layers 14 and 16, an organic silicon compound layer 15 and a second electroconductive interconnection film 21 are laminatedly formed on a silicon substrate 11. Then, a low temperature silicon oxide nitride layer 22 is formed on the second electroconductive film 21 by the plasma CVD method, and such an organic silicon compound formable a thick film as silicon polyimide is coated thereon, and thereafter, heat-treated and planarized. Thus, the second interlayer insulating film comprising the low temperature silicon oxide nitride layer 22 and the organic silicon compound layer 23 is formed as shown in FIG. 6. In addition, the low temperature silicon oxide nitride layer 22 may be formed of a low temperature silicon nitride by the plasma CVD method or of a low temperature silicon oxide by the plasma CVD or the bias sputtering technique.

Figure 7:
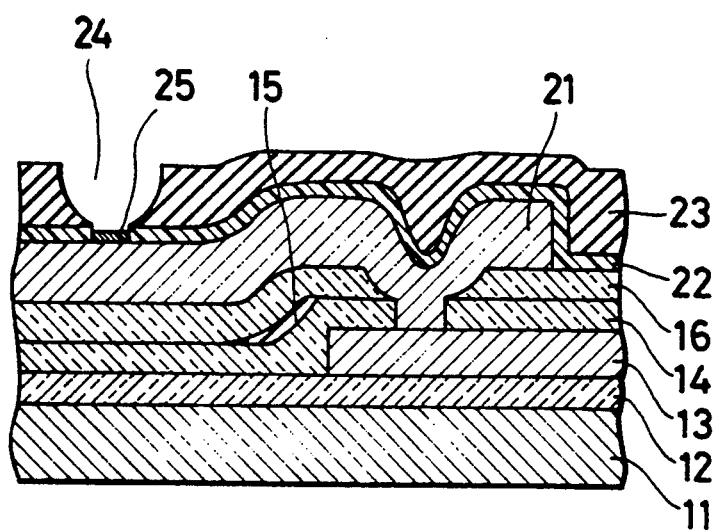

Next, through the photolithographic process, a through-hole 24 is perforated into the second interlayer insulating film so as to attain to the surface of the second example of perforating the through-hole 24 by etching it isotropically and anisotropically is shown. At the time point when the through-hole 24 is formed, on the surface of the second electroconductive film 21 exposed into the through-hole 24, an aluminum oxide 25 is existed as a reaction product of the aluminum atoms of the second electroconductive film 21 with the oxygen in the air as shown in FIG. 7.

Next, heat treatment is subjected thereto to remove gases including moisture contained in the organic silicon compound layer 23, and then, the sputter etching process is applied thereto in the same manner as was used in the first embodiment thereby removing the aluminum oxide 25 adhesively existed on the second electroconductive interconnection film 21, and the reaction product which is produced in the through-hole forming process and remained being not removably therefrom through the photo-resist removing process. At the time point when the sputter etching process is finished, on extraneous material 26 comprising an aluminum oxide, silicon oxide and the like is newly formed on the surface of the second electroconductive film 21 exposed into the through-hole 24.

Figure 8:
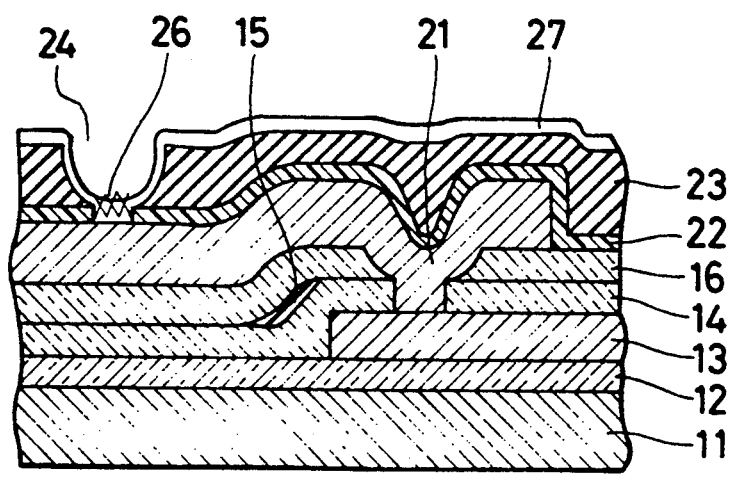

Next, as shown in FIG. 8, a film 27 made of the same material as is used for forming a third electroconductive interconnection film is provided by a sputtering method on the whole surface of the organic silicon compound layer 23 to cover the same. In this embodiment, a laminated film 28 comprising a titanium film 28a and a platinum film 28b is formed on the organic silicon compound layer 23 in the later process, so that the film 27 is made of the same material as was used for the film 28a disposed adjacently to the second interlayer insulating film, that is, titanium. The titanium film 24 has a thickness of about 40 nm on the top surface of the second interlayer insulating film and a thickness of about 5 to 20 nm on the side surface thereof within the through-hole 24. At the interface between the titanium film 27 and the second electroconductive film 21 at the bottom of the through-hole 24, an extraneous material 26 exists as shown in FIG. 8.

Figure 9:
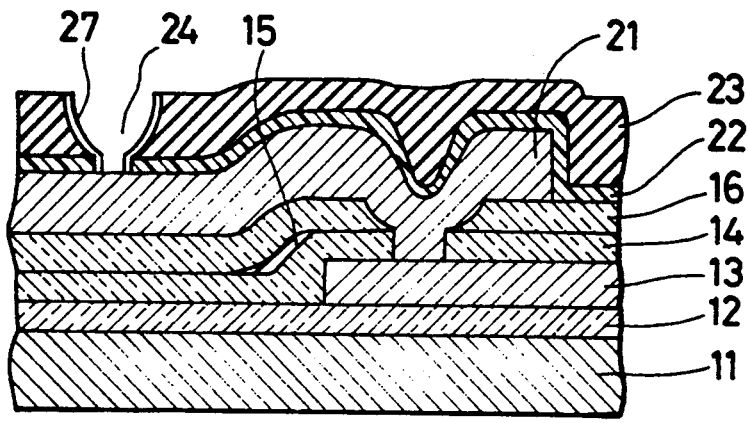

Next, the titanium film 27 is removed from the whole surface thereof by the sputter etching technique. At this time, the titanium film 27 can be completely removed from the surface of the second electroconductive film 21 exposed into the through-hole 24 and the top surface of the second interlayer insulating film, however it will be partially remained being not removably on the side surface of the secondo interlayer insulating film within the through-hole 24. The extraneous material 26 on the surface of the second electroconductive film 21 in the through-hole 24 can be removed together with the titanium film 27. The state of this is shown in FIG. 9.

In this process, the sputter etching is effected with the titanium film 27 as the target, so that no occurrence of a problem on the ohmic contact due to the re-adhesion of the titanium atoms dissociated therefrom through the sputter etching process results. Also, no re-combination of the oxygen dissociated from the second interlayer insulating film with the titanium results, so that no occurrence of a problem on the ohmic contact due to the existence of oxygen.

Subsequently, the titanium film 28a and the platinum film 28b are laminatedly formed on the organic silicon compound layer 23 at respectively predetermined levels of thickness by the sputtering process. These sputter etching and sputtering processes are carried out under the same vacuum condition.

Figure 10:
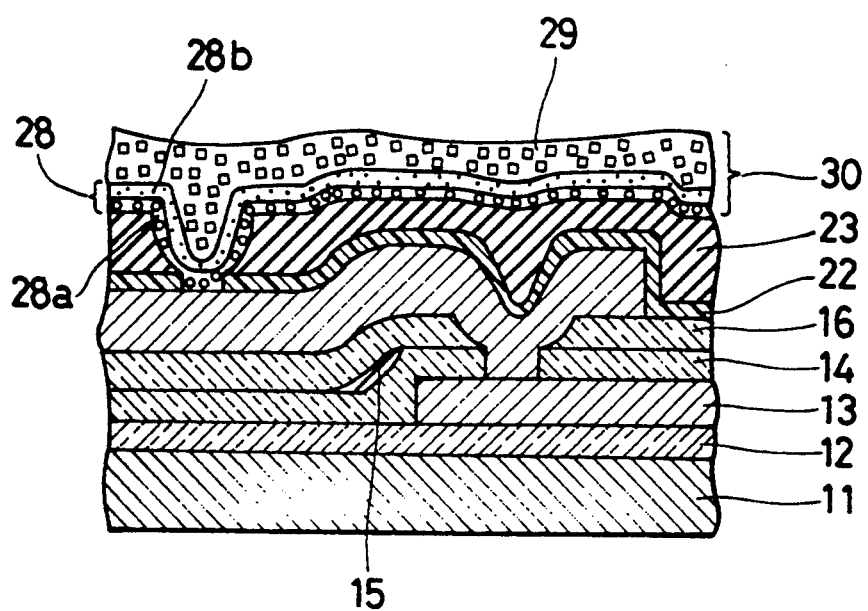

Next, heat treatment is subjected thereto, thus providing a stable ohmic contact in the through-hole 24. Then, a gold plate 29 is further formed on the platinum film 28b by, for example, the plating technique, and with it as the mask, a third electroconductive interconnection film 30 is formed by, for example, the reactive etching technique or the ion milling technique. Accordingly, the third electroconductive film 30 is a laminated film comprising the titanium film 28a, the platinum film 28b and the gold film 29. The state of this is shown in FIG. 10.

As described above, the method according to this invention makes it possible to eliminate almost perfectly the effects of a sputter etching caused extraneous material, which are arisen as a problem when the ohmic contact is to be taken between electroconductive interconnection films in a through-hole. As a result, the method of this invention can provide a multilevel interconnection structure which is stable and superior in the ohmic contact ability and highly resistant to the stress-migration and/or electro-migration at the interface of an electroconductive film in the through-hole. As a result, the product yield and reliability of integrated circuit apparatus on a production basis are effectively improved by using the method of this invention.

What is claimed is:

1. A method of forming multilevel interconnections in a semiconductor integrated circuit wherein electroconductive films are disposed adjacently with an insulating film sandwiched therebetween, said conductive films being connected to each other via a through-hole formed in said insulating film, said method comprising:

a first step of forming a first insulating film on a first electroconductive film;

a second step of forming a through-hole into said first insulating film, said through-hole reaching a surface of said first electroconductive film;

a third step of sputter etching to remove any extraneous material which may be existing on a surface of said first electroconductive film which is exposed into said through-hole;

a fourth step of forming a covering film on said first insulating film, said covering film being made of a material which is the same material that is used for forming a part of a second electroconductive film, that is closest to the covering film;

a fifth step of sputter etching to remove said covering film until extraneous material generated in said third step on said exposed surface of said first electroconductive film is fully removed and a surface of said first insulating film is fully exposed; and a sixth step of forming said second electroconductive film on said surface of said first insulating film to electrically interconnect said second electroconductive film with said first electroconductive film via said through-hole.

2. A method as claimed in claim 1, wherein said fourth step is carried out by sputtering.

3. A method as claimed in claim 2, wherein said third, fourth and fifth steps are successively carried out in a vacuum.

4. A method as claimed in claim 1, wherein said second electroconductive film is a single electroconductive layer.

5. A method as claimed in claim 1, wherein said second electroconductive film is a stacked plurality of electroconductive layers, and in which said covering film is a material which is the same material that forms the one of said stacked electroconductive layers which is nearest to said first electroconductive film.

6. A method as claimed in claim 1, wherein said covering film removed in said fifth step is removed from the bottom of the through-hole while leaving a portion thereof on a side surface of said through-hole in said insulating film.

7. A method as claimed in claim 1, wherein said sputter etching in said fifth step removes all particles from said insulating film to prevent unstable ohmic contacts which might otherwise be caused by said particles.

8. A method of forming a multilevel interconnection structure in a semiconductor integrated circuit apparatus, said method comprising:

a first step of forming a first insulating film on a first electroconductive film;

a second step of forming a through-hole into said first insulating film which reaches a surface of said first electroconductive film;

a third step of sputter etching to remove any extraneous material existing on a surface of said first electroconductive film exposed into said through-hole;

a fourth step of forming a covering film on said first insulating film, said covering film being made of a material which is the same material that is used for forming a part of a second electroconductive film; that is closest to the covering film;

a fifth step of sputter etching to remove said covering film until extraneous material generated in said third step on said exposed surface of said first electroconductive film is fully removed and a surface of said first insulating film is fully exposed; and a sixth step of forming said second electroconductive film on said surface of said first insulating film to electrically interconnect said first and second electroconductive films via said through-hole;

said fourth step being carried out by sputtering, and said third, fourth and fifth steps being carried out successively in a vacuum.

9. A method as claimed in claim 8, wherein said second electroconductive film is a single electroconductive layer.

10. A method as claimed in claim 8, wherein said second electroconductive film is a stacked plurality of electroconductive layers, said covering film being made of a material which is the same as the material of the one of said electroconductive layers which is nearest to said first electroconductive film.

11. A method as claimed in claim 8, wherein said covering film is removed from the bottom of said through-hole by the sputter of the fifth step while leaving a portion of said covering film on a side surface of said through-hole.

12. A method as claimed in claim 8, wherein said sputter etching in said fifth step removes particles from said insulating film to prevent unstable ohmic contacts which might otherwise be caused by said particles.

* * * * *